(12) United States Patent
Chang et al.

(10) Patent No.: US 7,875,808 B2
(45) Date of Patent: Jan. 25, 2011

(54) EMBEDDED CAPACITOR DEVICE HAVING A COMMON COUPLING AREA

(75) Inventors: Huey-Ru Chang, Hsinchu (TW); Min-Lin Lee, Hsinchu (TW); Shinn-Juh Lay, Hsinchu (TW); Chin Sun Shyu, Hsinchu (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 895 days.

(21) Appl. No.: 11/531,337

(22) Filed: Sep. 13, 2006

(65) Prior Publication Data

US 2007/0062726 A1     Mar. 22, 2007

Related U.S. Application Data

(60) Provisional application No. 60/718,413, filed on Sep. 19, 2005.

(51) Int. Cl.
*H05K 1/16* (2006.01)
(52) U.S. Cl. .................................... 174/260; 361/763
(58) Field of Classification Search ................ 174/260; 361/761–764
See application file for complete search history.

(56) References Cited

U.S. PATENT DOCUMENTS

| | | | |
|---|---|---|---|
| 5,027,253 A | 6/1991 | Lauffer et al. | |
| 5,422,782 A | 6/1995 | Hernandez et al. | |
| 5,972,231 A | 10/1999 | DiBene, II | |
| 2004/0118602 A1 | 6/2004 | Lee et al. | |
| 2006/0215380 A1 * | 9/2006 | Lu et al. ................ | 361/763 |

FOREIGN PATENT DOCUMENTS

| | | |
|---|---|---|
| CN | 1604720 | 4/2005 |
| DE | 10329657 | 7/2004 |
| JP | H63-117416 | 5/1988 |
| JP | H07-030258 | 1/1995 |
| JP | 2004-281169 | 10/2004 |
| JP | 2005-072311 | 3/2005 |
| TW | 591676 | 6/2004 |
| TW | I226101 | 1/2005 |

OTHER PUBLICATIONS

Chinese Office Action Issued in Counterpart Application No. 200601272719 (7 pages).
German Office Action Issued in Counterpart Application No. 10 2006043 032.8 (5 pages).
Japanese Office Action Issued in Counterpart Application No. 2006-252760 mailed Aug. 25, 2009 (2 pages).
Taiwanese Office Action Issued in Counterpart Application No. 095134480 (5 pages).

* cited by examiner

*Primary Examiner*—Jeremy C Norris
(74) *Attorney, Agent, or Firm*—Finnegan, Henderson, Farabow, Garrett & Dunner, LLP

(57) ABSTRACT

An embedded capacitor device within a circuit board having an integrated circuitry thereon is provided. The circuit board has a common coupling area under the integrated circuitry. The embedded capacitor device includes a first capacitor section providing at least one capacitor to a first terminal set of the integrated circuitry and a second capacitor section providing at least one capacitor to a second terminal set of the integrated circuitry. A portion of the first capacitor section is in the common coupling area and has its coupling to the first terminal set located in the common coupling area. Similarly, a portion of the second capacitor section is in the common coupling area and has its coupling to the second terminal set located in the common coupling area.

19 Claims, 11 Drawing Sheets

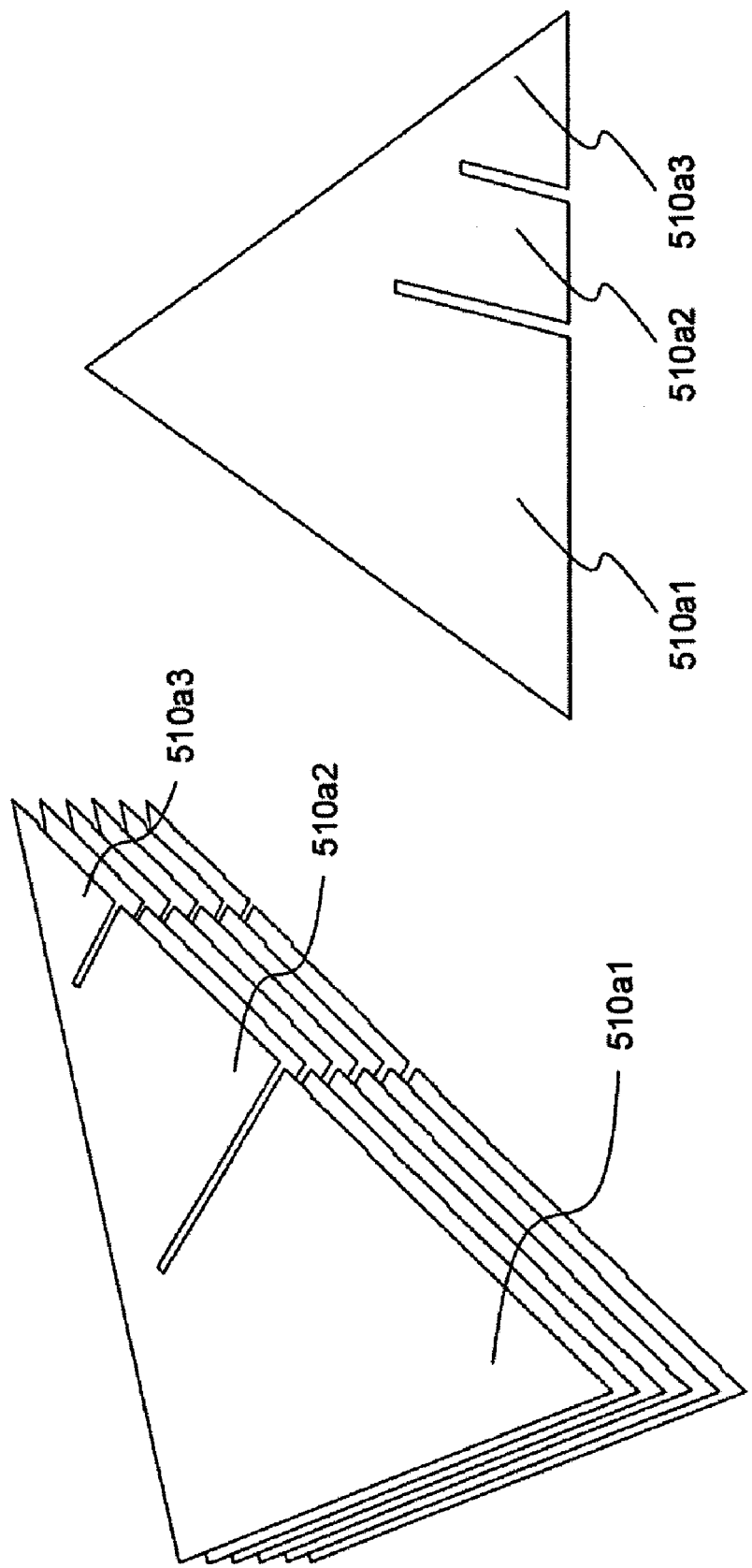

EMBEDDED CAPACITOR DEVICE HAVING A COMMON COUPLING AREA

CROSS-REFERENCE TO RELATED APPLICATIONS

This application claims priority from provisional patent application Ser. No. 60/718,413, filed on Sep. 19, 2005 and titled "Embedded Capacitor Device Having a Common Coupling Area." This application is related to co-pending application Ser. No. 11/470,435, titled "Embedded Capacitor Core Having a Multiple-Layer Structure" and filed on Sep. 6, 2006, which claims priority from provisional application Ser. No. 60/718,382, filed on Sep. 19, 2005 and titled "Embedded Capacitor Core Having a Multiple-Layer Structure."

BACKGROUND OF THE INVENTION

The present invention relates to an embedded capacitor device having a common coupling area and, more particularly, to an embedded capacitor device that can be embedded within a circuit board and provide a common coupling area for an integrated circuit.

Capacitors are electrical devices capable of storing or absorbing electrical charges. With the charge-storing capacity, capacitors have broad applications in the design and operation of electrical circuits, including integrated circuits ("ICs"). As an example, an IC itself may contain a number of capacitors coupled with other components for the IC's operations, such as signal processing. In addition to internal capacitors, an IC may also rely on external capacitors to stabilize power supply, to absorb undesirable fluctuations, or to reduce signal interference or noise. For example, an IC mounted on a printed circuit board ("PCB") may be coupled with ceramic capacitors that are also mounted on the PCB for one of those purposes, and the capacitors may be mounted using known surface mount technology ("SMT"). Alternatively, other types of capacitors may be mounted on or in the circuit board and coupled with the IC to provide similar effects as those SMT capacitors.

The coupling between an IC and external capacitors is generally achieved by constructing wiring paths, which may have a significant length compared to the couplings within the IC itself. In certain applications, the length of a winding or narrow path may create inductance from the path itself, leading to undesirable inductance effect affecting IC signals or operations. Additionally, SMT capacitors, although small in size, is also limited in its range of capacitances, the signal frequency it is capable of handling, or both. With the increasing speed of electrical circuits and other components and the shrinking size of devices and available PCB space, finding SMT capacitors that are capable of satisfying the design need becomes a challenge. Additionally, SMT capacitors mounted on a PCB requires certain board space and may limit the board space available for other devices. With the increasing terminals of IC and the densely arranged terminals, the wiring design for coupling the IC to external capacitors may also post another challenge.

Therefore, it may be desirable to provide a capacitor device that can be embedded into other structures, such as a circuit board. It may also be desirable to provide capacitor design that offers a wider range of capacitance. It may also be desirable to reduce the wiring paths from an IC to external devices such as capacitors or capacitive-inductive networks.

BRIEF SUMMARY OF THE INVENTION

One example consistent with the invention provides an embedded capacitor device within a circuit board having an integrated circuitry thereon. In particular, the circuit board has a common coupling area under the integrated circuitry. The capacitor device includes: a first capacitor section providing at least one capacitor to a first terminal set of the integrated circuitry, a portion of the first capacitor section being in the common coupling area and having its coupling to the first terminal set located in the common coupling area; and a second capacitor section providing at least one capacitor to a second terminal set of the integrated circuitry, a portion of the second capacitor section being in the common coupling area and having its coupling to the second terminal set located in the common coupling area. In one example, the first and second capacitor sections may belong to at least one common plane having at least two capacitor sections that are horizontally arranged.

Another example consistent with the invention provides an embedded capacitor device within a circuit board having an integrated circuitry thereon. The circuit board has a common coupling area under the integrated circuitry. The embedded capacitor device includes: a first capacitor section providing at least one capacitor to a first terminal set of the integrated circuitry, a portion of the first capacitor section being in the common coupling area and having its coupling to the first terminal set located in the common coupling area; and a second capacitor section providing at least one capacitor to a second terminal set of the integrated circuitry, a portion of the second capacitor section being in the common coupling area and having its coupling to the second terminal set located in the common coupling area.

Another example consistent with the invention provides a printed circuit board. The printed circuit board includes at least one embedded capacitor device, each embedded capacitor device including a plurality of layers to form a plurality of capacitor structures. In particular, the embedded capacitor device includes at least two capacitor sections each having a portion of the capacitor section within a common coupling area for an integrated circuitry.

BRIEF DESCRIPTION OF THE SEVERAL VIEWS OF THE DRAWINGS

The following description of the embodiments of the invention may be better understood when read in conjunction with the appended drawings. The drawings are for the purpose of illustrating certain embodiments of the invention. It should be understood, however, that the invention is not limited to the precise arrangements and instrumentalities shown. In the drawings:

FIG. 10A illustrates a schematic example of providing a capacitor section having three capacitors combined horizontally, shown from a perspective view;

FIG. 10B illustrates a schematic example of providing a capacitor section having three capacitors combined horizontally, shown from a top view.

DETAILED DESCRIPTION OF THE INVENTION

Examples of the present invention include an embedded capacitor device having a common coupling area. As an example, the embedded capacitor may include a multiple-layer capacitor structure formed from conductive patterns and can be embedded within a circuit board or PCB (printed circuit board) to serve as an embedded decoupling capacitor ("EDC"). In one example, the circuit board has at least one integrated circuit thereon and the common coupling area may be below the integrated circuit. In some example, the circuit board itself may also provide a common coupling area for the capacitor device.

In the design of ICs, currents flowing through power, ground, and other signal terminals. Unfortunately, false signaling may occur due to power/ground bounces and voltage/current switching noises. Appropriate external circuitry, such as a decoupling capacitor circuitry, may distribute or decouple undesirable bounces in power terminals or signal noises to minimize its unintended effect on circuit operation. The reduction or removal of undesirable power/ground bounces or signal noise also may reduce the electromagnetic interference ("EMI") caused by the IC or the system, which may have effects on other surrounding circuitry or systems. There may exist many factors affecting the efficiency of decoupling capacitors, such the capacitance value(s) of decoupling capacitors, the number of decoupling capacitors, lengths of wiring paths, frequency or frequencies of signal noise, etc. As the operation of ICs gets faster, the frequency of the associated noise, such as signal or power switching noise, also gets higher, which may require more decoupling capacitors and/or decoupling capacitors with better characteristics.

Figure 1:
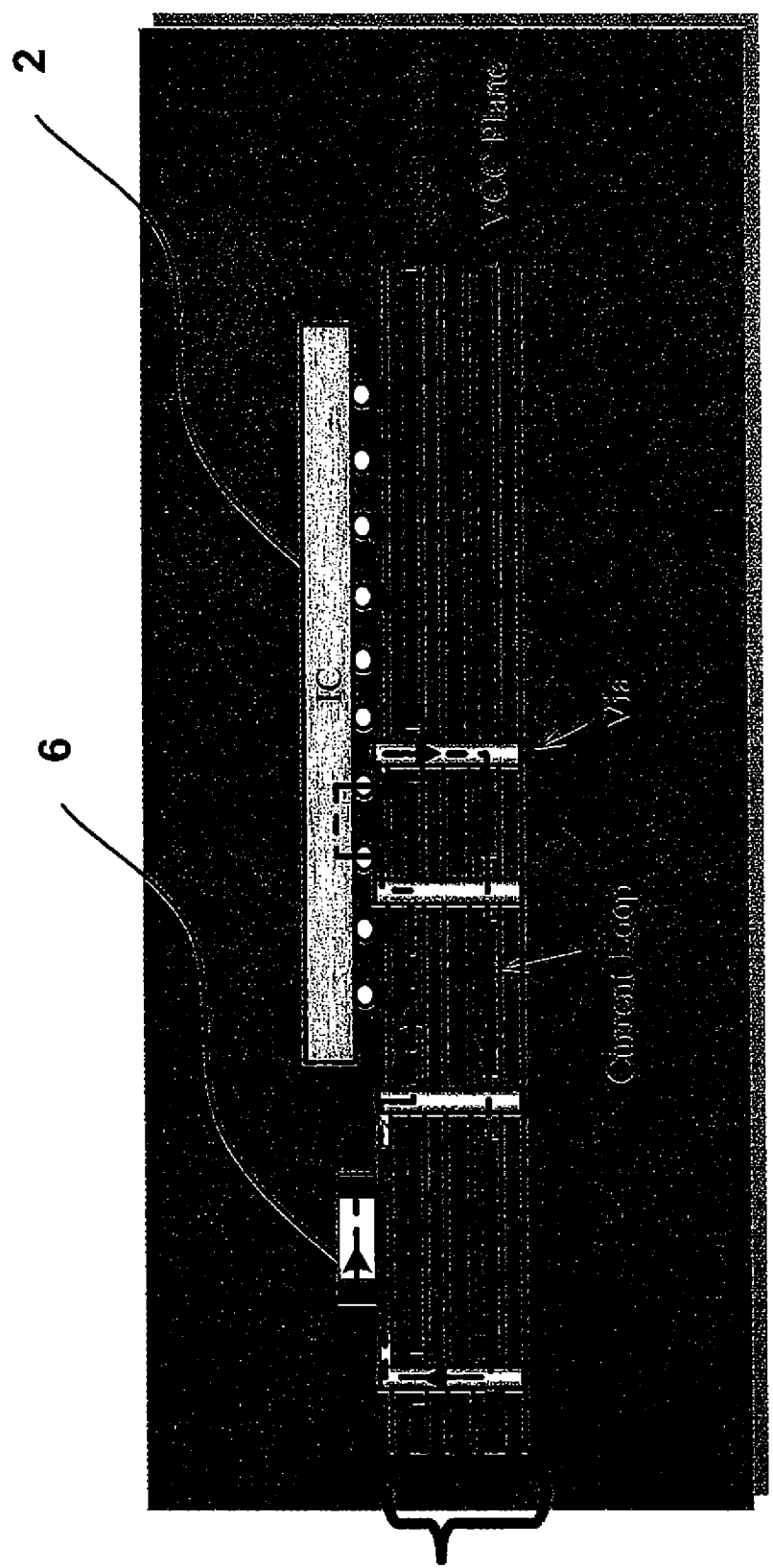
FIG. 1 illustrates a schematic example of an external decoupling capacitor Configuration for an IC.

FIG. 1 illustrates a schematic example of an external decoupling capacitor configuration for IC 2, which may be provided on or mounted onto circuit board 4. Referring to FIG. 1, one or more sets of power or signal terminals of IC 2 may be coupled to one or more external capacitive loops, such as external capacitor 6. In order to couple with capacitor 6, a power terminal VCC of IC 2 may be wired through a lower wiring layer of PCB 4, such as the VCC plane shown in FIG. 1. And a ground terminal GND of IC 2 may be wired through an upper wiring layer of PCB 4, such as the GND plane shown in FIG. 1. However, as illustrated in FIG. 1, the extended wiring configuration may result in a long current loop for the capacitor connections, which may have significant inductance effects. The inductance effects may impact the external capacitors' effectiveness in reducing undesirable ground or power bounces or noises in some examples.

Figure 2:
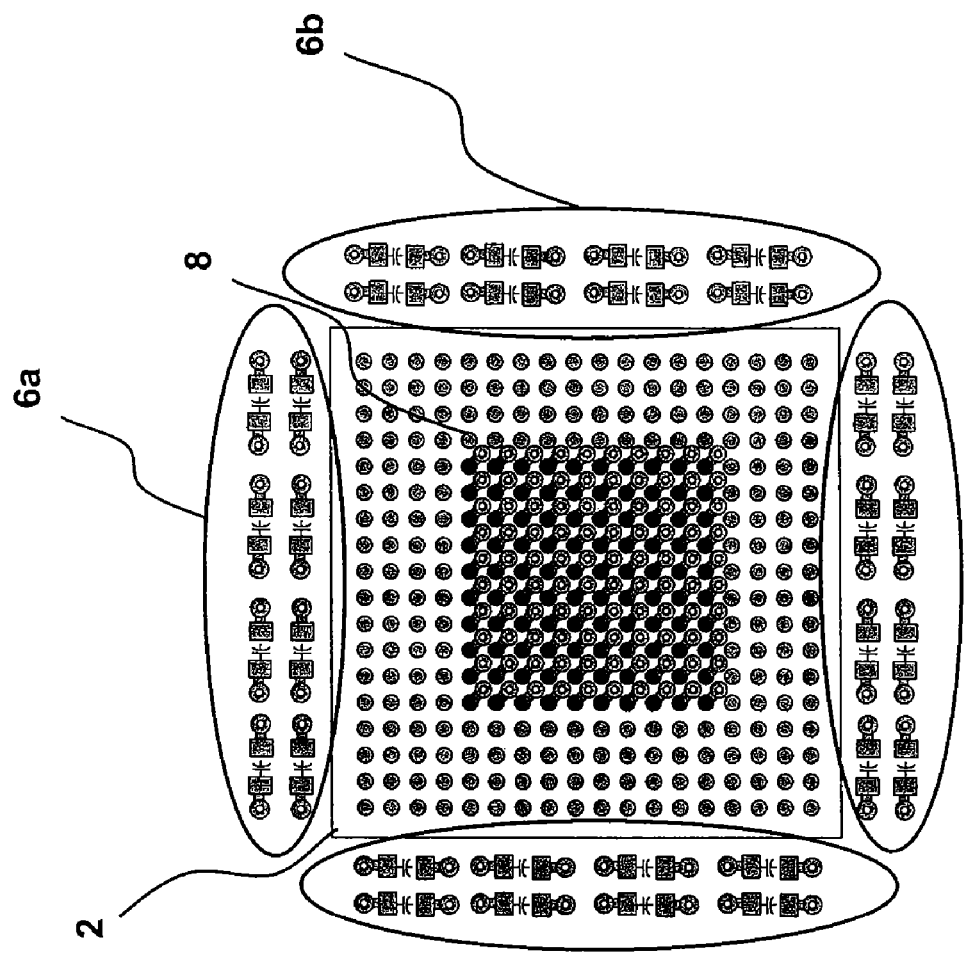
FIG. 2 illustrates a schematic example of a plurality of SMT capacitors for an IC.

In addition to the issue of inductance effects, there may be issues with circuit board surface areas. As the operation speed of IC 2 increases, there may be a need for more capacitors, including SMT capacitors, which occupy additional circuit board areas and require more extended wiring paths. FIG. 2 illustrates a schematic example of a plurality of SMT capacitors, such as SMT group 6a and 6b, for IC 2. As illustrated, IC 2 may have one or more sets of power terminals, which may need external capacitors for reducing noises, reducing power/ground bounces, and/or stabling the voltage levels. However, quite a number of SMT capacitors may be needed, and the coupling from the power terminals to the capacitor groups may also require extended current loops. As a result, SMT capacitors may not be the appropriate solution in certain cases.

Figure 3:
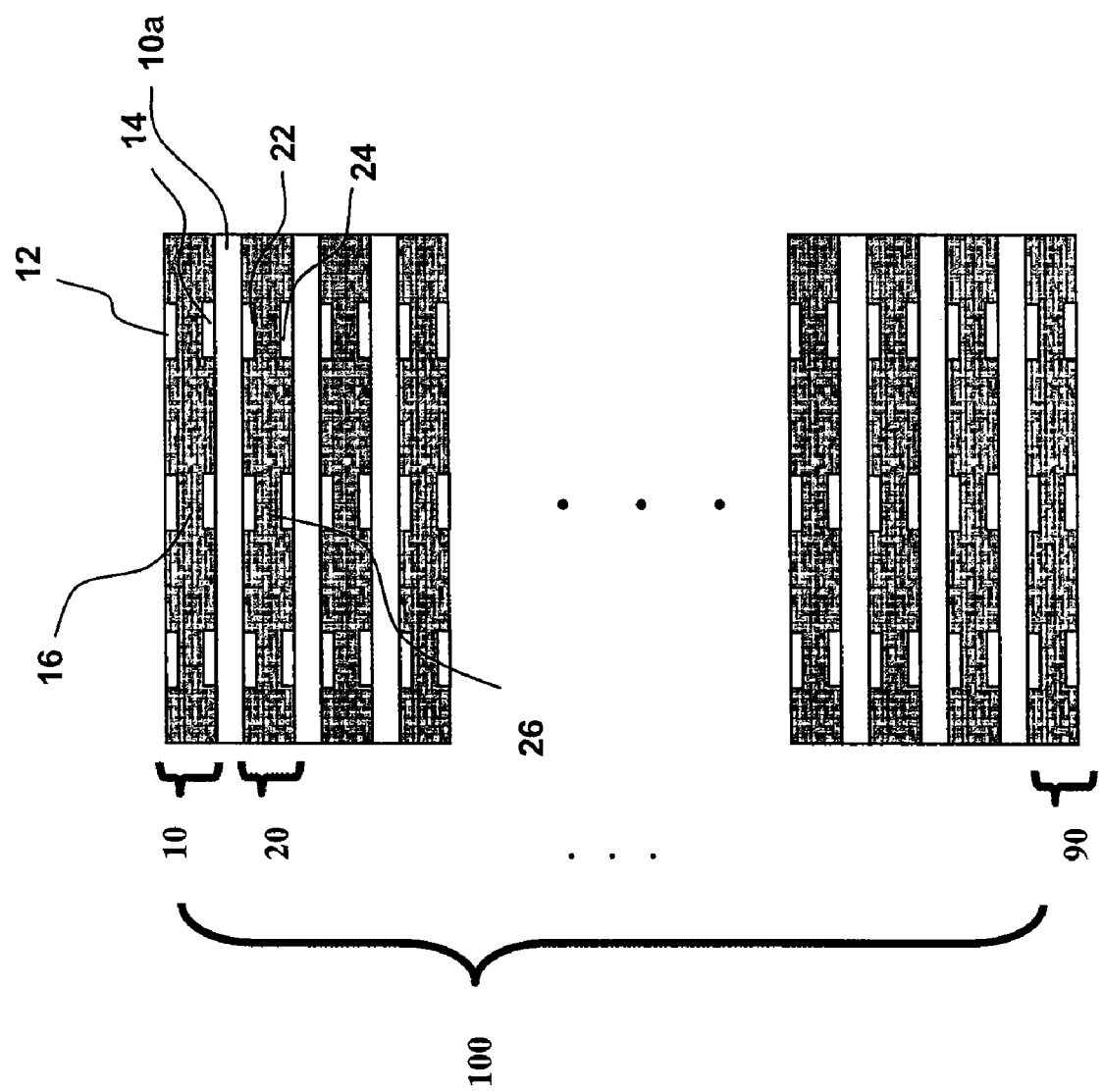
FIG. 3 illustrates a schematic example of an embedded capacitor core having several layers of conductive patterns with conductive electrodes.

Examples of the invention provide embedded capacitor devices that may provide adequate capacitances by having a multi-layer structure and may avoid occupying surface area of a circuit board. For example, the embedded capacitor device may be incorporated within a circuit board or a printed circuit board without occupying surface space. FIG. 3 illustrates a schematic example of embedded capacitor core 100. In some examples, one or more of core 100 may serve as the embedded capacitor device. As illustrated in this example, embedded capacitor core 100 may include multiple sub-structures, each of which may contain a set of capacitors. For example, embedded capacitor core 100 may include first core 10, second core 20, all the way through Nth core 90, each of which contains a set of capacitors. In some examples, one or more ICs may share one or more embedded capacitor structure having one or more common coupling areas.

Referring to FIG. 3, first set of capacitors 10 may include first conductive pattern 12, which has two or more conductive electrodes, and second conductive pattern 14, which also has two or more conductive electrodes that may correspond to the two conductive electrodes of first conductive pattern 12. Between the two conductive patterns 12 and 14, there is a first dielectric film or material. The term "correspond to", in some examples, can encompass a functional correspondence, such as the interaction between two electrodes, or a physical correspondence, such as the physical location or size of two electrodes. Similar to first set of capacitors 10, second set of capacitors 20 may include a third conductive pattern 22, which has two or more conductive electrodes, and a fourth conductive pattern 24, which also has two or more conductive electrodes that may correspond to the two conductive electrodes of third conductive pattern 22. Similarly, between the two conductive patterns 22 and 24, there is a second dielectric film or material.

Figure 4:
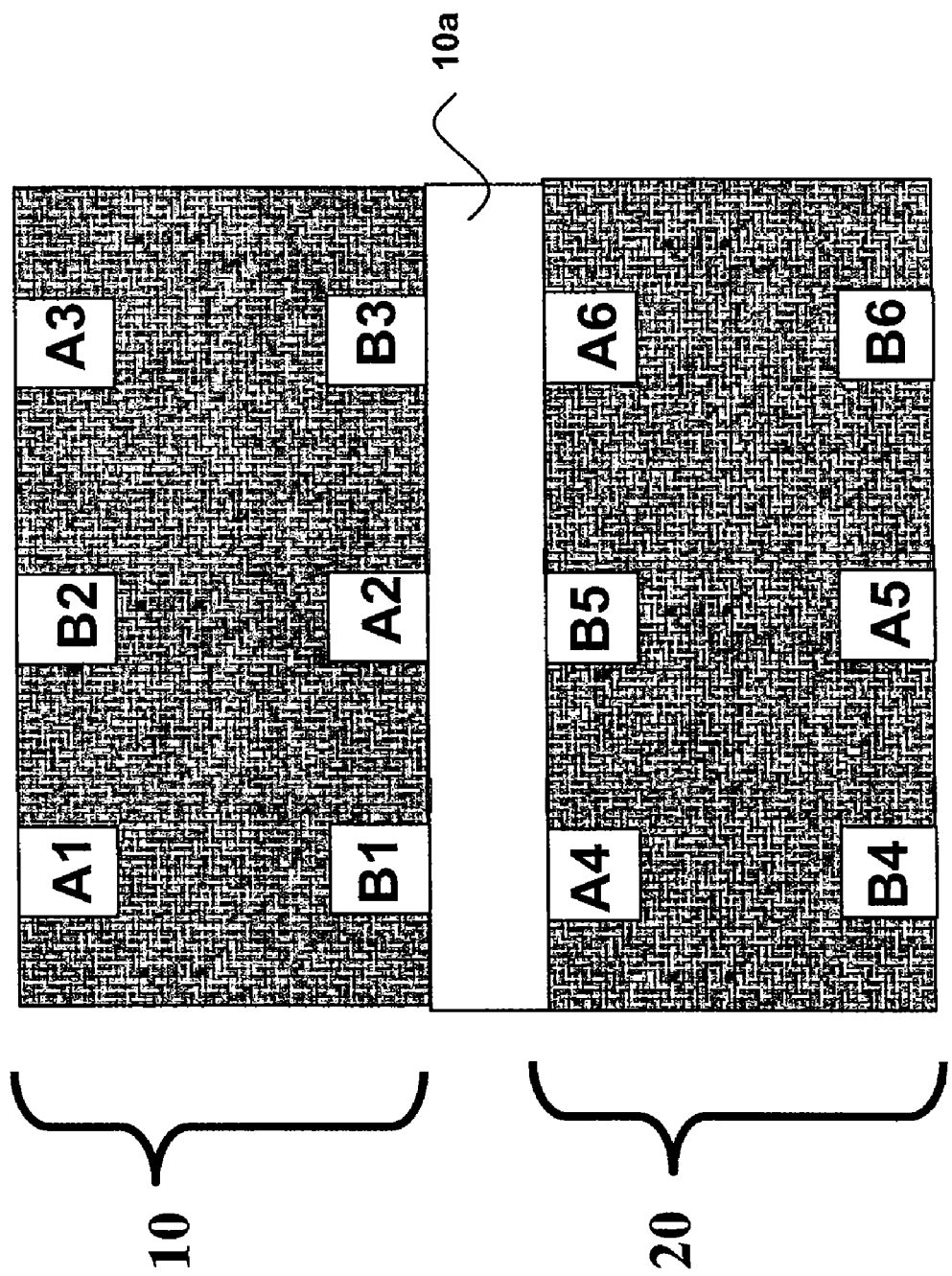
FIG. 4 illustrates a schematic example illustrating the couplings of separate electrodes of an embedded capacitor core.

To stack two or more sets of capacitors illustrated above, inter-layer dielectric film or material 10a can be provided between first set of capacitors 10 and second set of capacitors 20. As noted above, embedded capacitor core 100 may be embedded within a circuit board. Additionally, it is noted that the conductive patterns illustrated in FIG. 4 are merely an illustrative example, and each layer of the conductive patterns and dielectric film may vary in its shape, size, and thickness for various design considerations, such as capacitance, operational frequency, IC terminal locations, etc. In one example, at least one of the conductive electrodes of first or second conductive pattern 10 can be electrically coupled to at least one of the conductive electrodes of the third or fourth conductive pattern to form a third set of capacitor or capacitors. To provide the electrodes, the first, second, third, and fourth conductive patterns 12, 14, 22, and 24 include conductive materials, such as metal, and copper may be used in one example. Different dielectric materials may be used as dielectric films or materials 16 and 26. In one example, at least one of first and second dielectric films 16 and 26 may have a dielectric constant of about 40 or above. In addition, either an organic or non-organic material, or a combination of the two, may be used as first and second dielectric films 16 and 26.

The formation of capacitors among the electrodes of the first, second, third, and fourth conductive patterns have numerous possibilities. Depending on the electrode couplings and the configurations, embedded capacitor core 100 illustrated in FIG. 3 may provide a single capacitor jointly formed by all the electrodes or a number of separate capacitors separately formed from electrode pairs. In other words, multiple capacitors may be arranged horizontally, vertically, or in a combined manner. FIG. 4 illustrates a schematic example illustrating how separate electrodes of core 10 and core 20 may be coupled. In some examples, the electrodes may be "crossly" coupled to provide one or more capacitors. For example, core 10 and core 20 may provide multiple capacitors jointly as one single capacitor or two or more capacitors. In one example, electrodes A1 through A6 can be jointly coupled to as one terminal, and electrodes B1 through B6 can be jointly coupled to as another terminal, there by forming capacitors at least between each of the A1-B1, A2-B2, A3-B3, A4-B4, A5-B5, A6-B6, A1-B2, B2-A3, B1-A2, A2-B3, B1-A4, A2-B5, B3-A6, A4-B5, B5-A6, B4-A5, and A5-B6 electrode pairs.

The design of the conductive patterns and the coupling of the electrodes in those conductive patterns can be modified in numerous ways to suit different design needs, either as embedded decoupling capacitors or other capacitive devices. The above example is merely illustrative, and the various design changes that may be made by persons skilled in the art for different applications based the teaching of this application.

Figure 5:
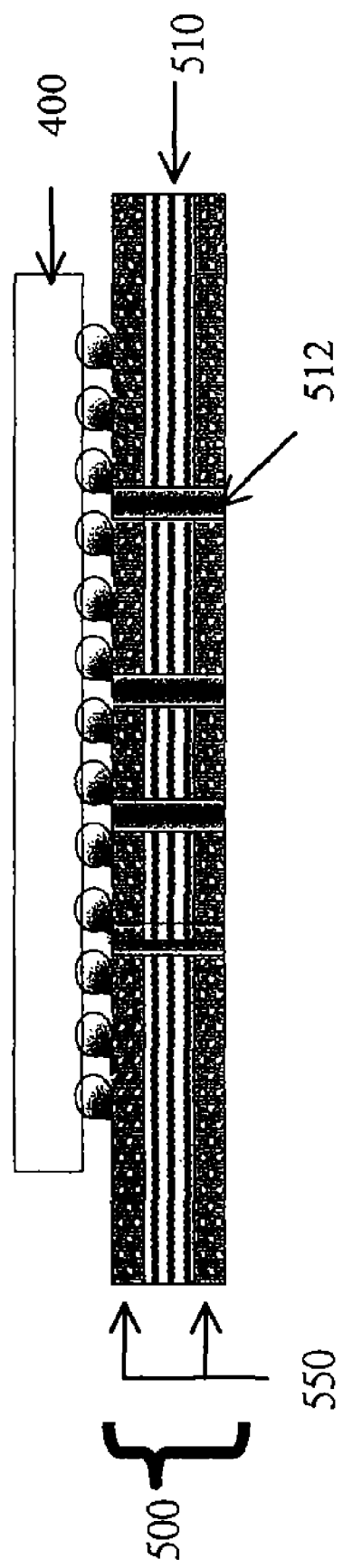
FIG. 5 illustrates a schematic example of a circuit board incorporating an embedded capacitor core.

With the design of an embedded capacitor core as illustrated above, the embedded core may be incorporated into a circuit board to provide adequate capacitance without occupying the surface area of the circuit board. FIG. 5 illustrates a schematic example of circuit board 500 incorporating embedded capacitor core 510 therein. In some examples, embedded capacitor core 510 may provide more than one capacitors, and separate capacitors may be coupled to separate terminals or separate pairs of terminals of IC 400. And vertical connections 512, such as conductive vias, may be used to establish such connections. In one example, more than one embedded capacitor core similar to core 510 may be incorporated in circuit board 500. For example, circuit board 500 may have a multi-layer structure having two or more embedded capacitor cores and one or more wiring layers.

Figure 6:
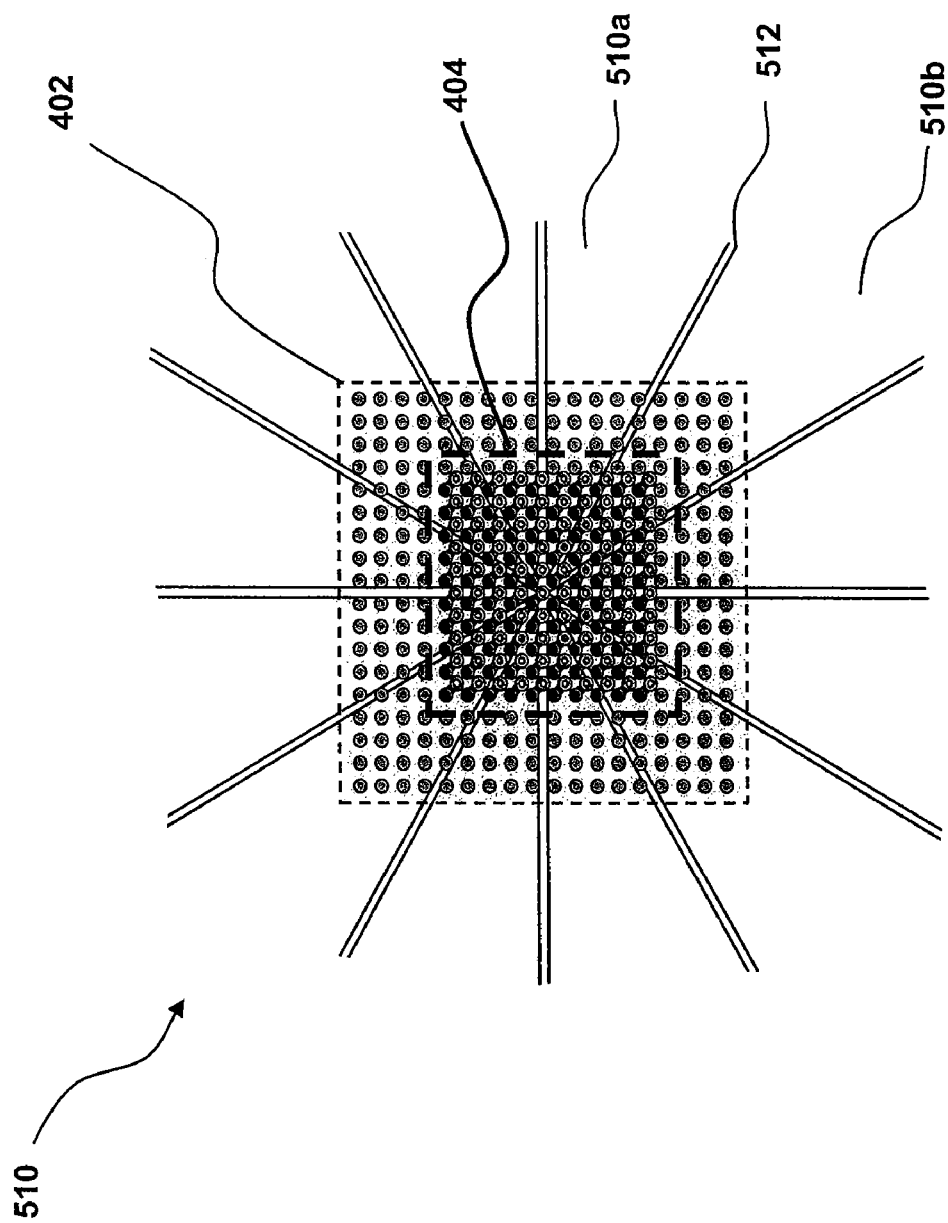
FIG. 6 illustrates a schematic example of an embedded capacitor device shown from the top view of a circuit board.

FIG. 6 illustrates a schematic example of embedded capacitor device 510 shown from the top view of a circuit board. As an example, embedded capacitor device 510 as illustrated may be incorporated in a circuit board as a portion of the circuit board, such as one or more layers within a multi-layer circuit board. In some examples, separate terminals or terminal sets of an IC located on a circuit board may be coupled with separate capacitors, such as separate decoupling capacitors. Therefore, embedded capacitor device 510 may be divided into separate capacitor sections with a common coupling area to provide direct couplings to the terminals or terminal sets of the IC, and the common coupling area may be under or directly under the IC.

The circuit board, such as circuit board 500 shown in FIG. 5, may be a multi-layer circuit board with embedded capacitor device 510 as one of its layers. Circuit board 500 may have IC 400 provided or mounted thereon. For example, IC 400, which may be in the form or a packaged or unpackaged chip with an electrical circuitry therein, may occupy area 402 or a portion of it as shown in FIG. 6. In some examples, circuit board 500 may have common coupling area 404 that is under or directly under the IC, and common coupling area 404 may allow direct couplings from some of the terminals of the IC to the embedded capacitor device to be formed, such as in the form of conductive wiring or vias. It is noted that the area for common coupling area 404 in FIG. 6 is merely illustrative, and the common coupling area 404 may be as large as IC area 402 or the area that encompasses all the pins of IC 400 in FIG. 5.

In one example, the embedded capacitor device may have two or more capacitor sections located on the same horizontal plane, which is a plane parallel to the drawing surface of FIG. 6. For example, referring to FIG. 6, the embedded capacitor may include first capacitor section 510a and second capacitor section 510b adjacent to each other with insulative material 512 between the two sections. Although FIG. 6 illustrates an example of having 12 separate capacitor sections in one embedded capacitor device 510, the number of sections in one embedded capacitor device may vary to fit different design needs. Additionally, each of the capacitor sections may extend outwardly from common coupling area 404 and may vary its shape within area 404 or after extending out from area 404 in order to provide adequate capacitance value and operational characteristics.

Referring to again to FIG. 6, taking first capacitor section 510a as an example, capacitor section 510a may provide at least one capacitor to a first terminal set of the IC, which is above area 404. Additionally, a portion of first capacitor section 510a is in common coupling area 404 and may have its coupling(s) to the first terminal set located in common coupling area 404. The coupling or couplings may be achieved by one or more wiring paths or vertical vias, which are represented by the small circles in area 404. Depending on the design and/or operational needs, the IC may have one or more terminal or terminal sets that require external couplings to capacitors. As an example, the first terminal set may be coupled to a pair of power supply terminals for the IC. Similar to first capacitor section 510a, second capacitor section 510b may provide at least one capacitor to a second terminal set of the IC. And a portion of second capacitor section 510b is in common coupling area 404 and may have its coupling(s) to the second terminal set located in common coupling area 404. Similarly, the coupling or couplings may be achieved by one or more wiring paths or vertical vias. As an example, the second terminal set may be coupled to another pair of power supply terminals for the IC or a pair of signal terminals. In some examples, if a capacitor section has a multiple-layer structure that has its layers arranged vertically, the common coupling area may extend to one or many layers of the multiple-layer structure. Additionally, although the separate capacitor sections as illustrated are arranged horizontally, they can also have a vertical arrangement or a combined (some vertical and some horizontal) in other examples.

In the example illustrated in FIG. 6, first and second capacitor sections 510a and 510b may belong to at least one common plane of an embedded capacitor core embedded in the circuit board 500. Using the embedded capacitor core of FIG. 4 as an example, first capacitor section 510a may be formed by electrodes A1, B1, A4, and B4, and second capacitor section 510b may be formed by electrodes B2, A2, B5, and A5. If the embedded capacitor core has more layers, each of the capacitor sections may also include the electrodes in the additional layers of the capacitor core.

Figure 7:
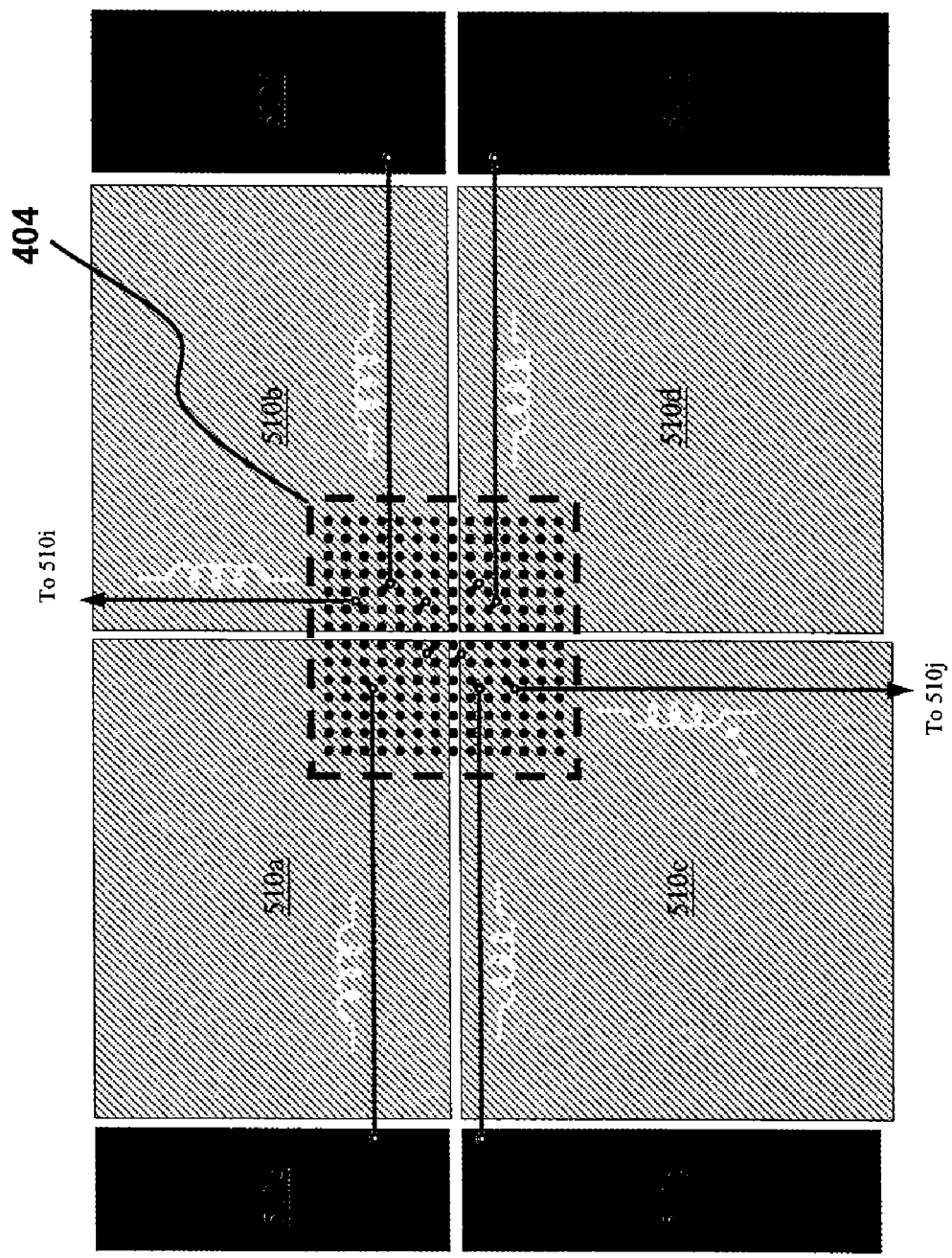
FIG. 7 illustrates a schematic example of dividing an embedded capacitor device into multiple capacitor sections.

FIG. 7 illustrates another schematic example of dividing an embedded capacitor device. Referring to FIG. 7, the embedded capacitor device may be divided into several rectangular capacitor sections 510a-510h shown in FIG. 7 and additional sections 510*i* and 510*j* not shown in FIG. 7. In this example, capacitor sections 510*a*-510*d* may have a portion of them remain in common coupling area 404, which is below an IC, thereby allowing direct couplings from the IC to these four capacitor sections without going through extended wiring paths. However, in some examples, the IC may have more than four terminal or terminal sets that may require more than four external capacitors or more than four capacitor sections. To couple to those additional capacitors capacitor sections, such as capacitor sections 510*e*, 510*f*, 510*g*, 510*h*, 510*i*, 510*j*, the IC may need to go through certain wires having lengthy wiring paths. In some examples, those wiring paths, such as the ones shown in FIG. 7, may be thin paths that can cause some inductance effect. Depending on the design of the circuit board containing the embedded capacitor device and wiring layers, the inductance effect may be undesirable in some cases and may impact the effectiveness of the external capacitor loops containing capacitor sections 510*e*-510*j*.

Figure 8:
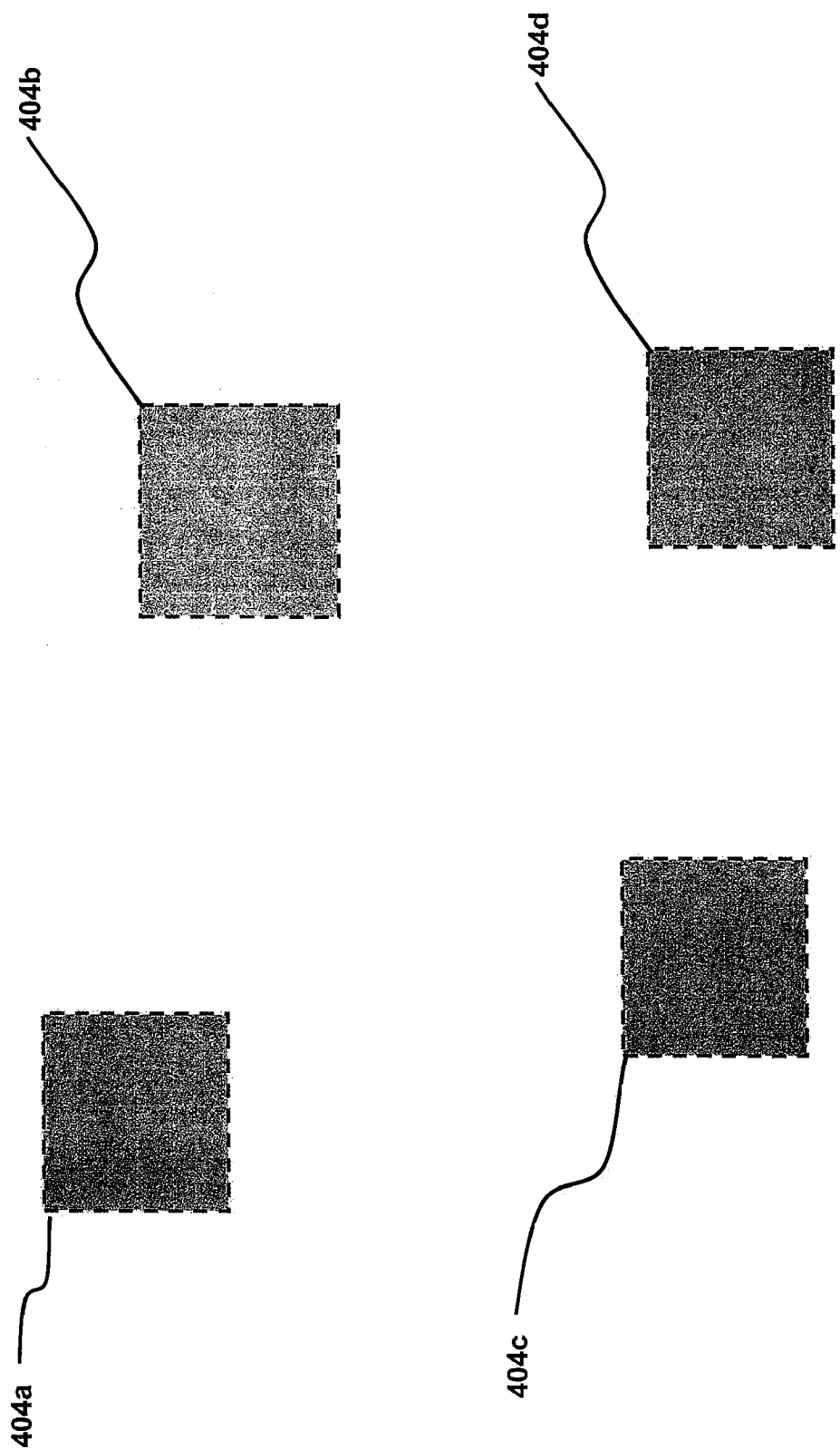
FIG. 8 illustrates another schematic example of dividing an embedded capacitor device into rectangular capacitor sections.

FIG. 8 illustrates another schematic example of dividing an embedded capacitor device. Referring to FIG. 8, the embedded capacitor device may be divided into a plurality of rectangular capacitor sections. In some examples, those capacitor sections may be divided in a way to match or be close to the areas for the corresponding ICs or corresponding common coupling areas that require the capacitor sections, thereby allowing direct or less indirect couplings from the ICs to the corresponding capacitor sections. However, in some examples, some ICs may have more than three or four terminal or terminal sets that may require more than three or four external capacitors or more than three or four capacitor sections. And some of the external couplings from the ICs to some of their corresponding capacitor sections may still need to go through extended wiring paths, which may cause some inductance effects or may impact the effectiveness of the external capacitor loops in some cases.

In some examples, the embedded capacitor device may be employed as decoupling capacitors of an IC. Due to the various design needs of the IC, it may require more than one capacitor for some or all of the IC terminal sets in some cases. For example, a pair of power terminal set may require two or three capacitors in parallel to provide better characteristics, such as to reduce noises of different frequencies. As an example, capacitors of different capacitance values or of different configurations may have different frequency responses, thereby providing better noise-canceling effects for noises covering various frequencies.

Figure 9A:
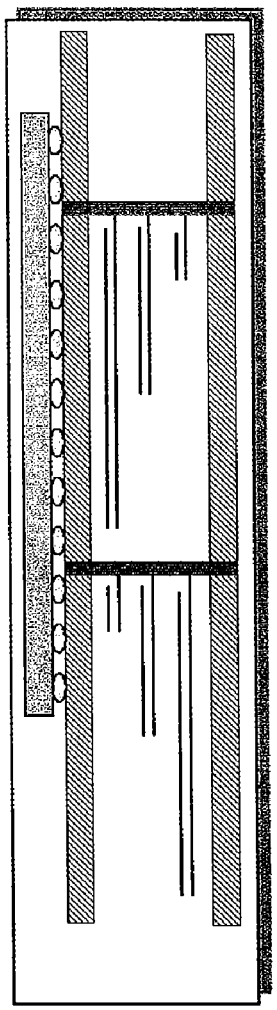
FIGS. 9A and 9B illustrate two schematic examples of providing a capacitor section having three capacitors combined vertically.
Figure 9B:
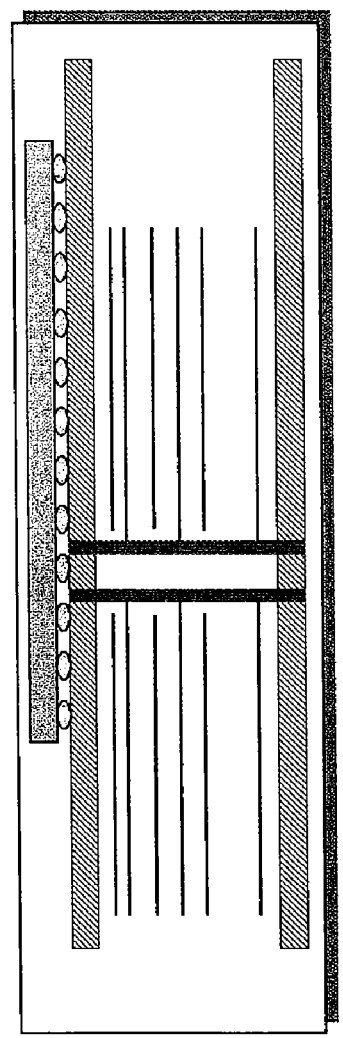

A capacitor section having two or more capacitors may have its capacitors combined vertically, horizontally, or both. FIGS. 9A and 9B illustrate two schematic examples of providing capacitor sections having three capacitors combined vertically. Referring to FIG. 9A, three capacitors arranged vertically at the left are coupled through vertical vias to the first terminal set of an IC, and three capacitors arranged vertically at the right are also coupled through vertical vias to the second terminal set of the IC. Referring to FIG. 9B, three capacitors arranged vertically at the left belong to a first capacitor section, which is coupled through vertical vias to the first terminal set of an IC. And three capacitors arranged vertically at the right belong to a second capacitor section, which are also coupled through vertical vias to the second terminal set of the IC. In FIG. 9B, the vertical vias of the first and second capacitor sections are arranged in close proximity in one common coupling area under or directly under the IC.

FIGS. 10A and 10B illustrate a schematic example of a capacitor section having three capacitors combined horizontally. FIG. 10A illustrates the capacitor section from a perspective view, and FIG. 10B illustrates the capacitor section from the top view. Referring to FIG. 10A, a capacitor section may have two or more conductive patterns having the same shape or similar shapes. Each conductive pattern may be divided into a few electrode areas that remain interconnected, such as first electrode 510*a*1, second electrode 510*a*2, and third electrode 510*a*3. With the multi-layer conductive pattern configuration shown in FIG. 10A, first electrode 510*a*1 and the overlapping or corresponding electrodes from other layers of conductive patterns may provide a first capacitor; second electrodes 510*a*2 and the overlapping or corresponding electrodes from other layers of conductive patterns may provide a second capacitor; and third electrodes 510*a*3 and the overlapping or corresponding electrodes from other layers of conductive patterns may provide a third capacitor.

In one example, three capacitors of different capacitance values may be provided from such configuration. For example, the capacitor containing first electrode 510*a*1 may provide the largest capacitance value among the three, the capacitor containing second electrode 510*a*2 may provide the second largest capacitance value among the three, and the capacitor containing third electrode 510*a*3 may provide the smallest capacitance value among the three. Having multiple capacitors may allow the combined device to provide better frequency responses, such as providing good noise reduction effects on separate frequency spectrums. In the example illustrated in FIGS. 10A and 10B, the capacitor section as shown may include three horizontally combined capacitors coupled in parallel. In the illustrated example, the capacitors are coupled in parallel by the design of the interconnections among the first, second, and third electrodes 510*a*1-510*a*3 themselves and without relying on additional wirings. Therefore, the capacitor section may provide multiple capacitors without having the undesirable effect caused by long wiring paths in some examples. FIG. 10B illustrates the capacitor section illustrated in FIG. 10A from the top view.

Figure 11B:
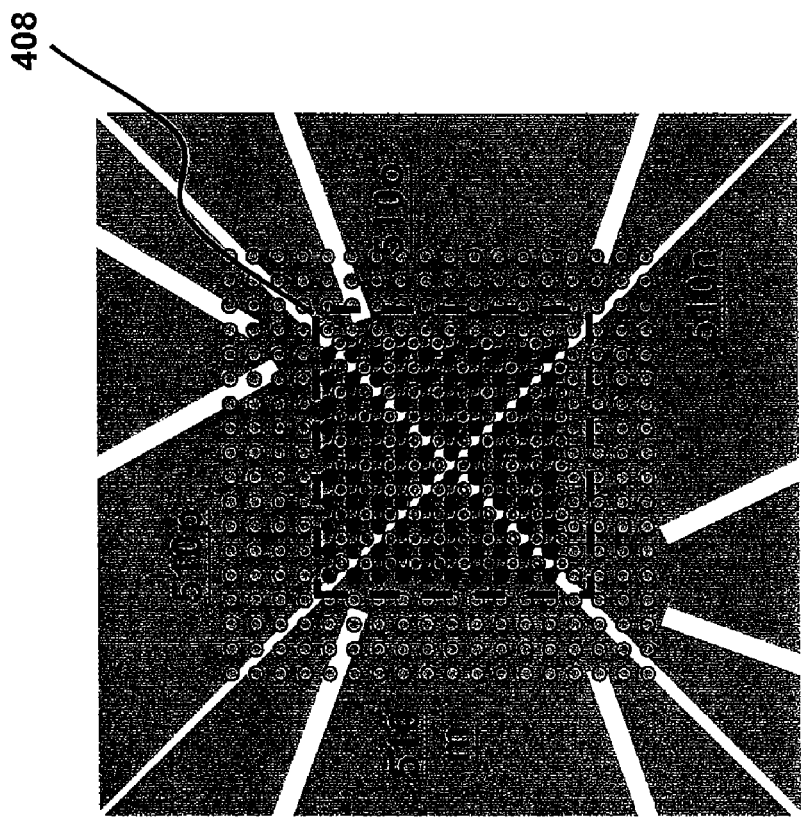
FIGS. 11A and 11B illustrate a schematic example of an embedded capacitor device having four capacitor sections, with each capacitor section having two or more capacitors combined horizontally.
Figure 11A:
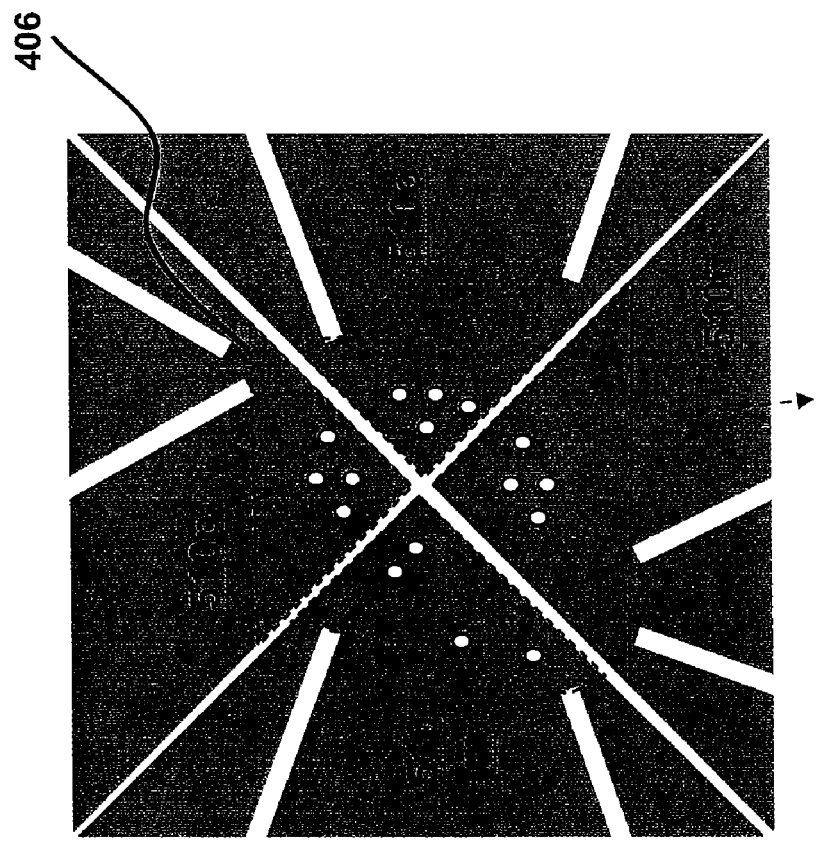

The configuration of combining two or more capacitors to provide one capacitor section may be applied to the configuration of having a common coupling area illustrated above. FIG. 11A and 11B illustrate a schematic example of an embedded capacitor device having four capacitor sections, with each capacitor section having two or more capacitors combined horizontally. A circuit board having a multi-layer structure may incorporate, as one of its layers, an embedded capacitor device similar to the one illustrated in FIG. 11A. The circuit board may have an IC provided or mounted thereon, such as an IC with a plurality of pins shown in FIG. 11B. Common coupling area 406 illustrated in the center of FIG. 11A, i.e. the area surrounded by dashed lines, may be under or directly under the IC and may be used to provide at least some direct couplings from some IC terminals to the embedded capacitor device. For example, the direct couplings may be in the form of vertical vias extending from the IC terminals to the corresponding capacitor sections, such as capacitor sections 510*m*-510*p*. As illustrated in FIG. 11B, providing common coupling area 408 may allow one or more capacitors to be coupled directly to pins or terminals of an IC without going through extensive wiring, or sometimes directly through vertical vias. In some example, the common coupling area 408 may provide couplings from one or more sets of terminals of an IC to multiple capacitors at the same time without extensive wirings.

Similar to the capacitor sections illustrated in FIG. 6, those capacitor sections illustrated on FIG. 11A may be placed on the same horizontal plane, which is a plane parallel to the drawing surface of FIG. 11A. For example, referring to FIG. 11A, the embedded capacitor may include first capacitor section 510*m* and second capacitor section 510*n* adjacent to each other with insulative material between the two sections. Although FIG. 11A illustrates a schematic example of having four capacitor sections in one embedded capacitor device, the number of sections in one embedded capacitor device may vary to fit different design needs. Additionally, each of the capacitor sections may extend outwardly from common coupling area and may vary its shape within area 404 or after extending out from area 404 in order provide adequate capacitance value(s) and operational characteristics.

In addition to combining the capacitors of a single capacitor section vertically or horizontally, a capacitor section may have both kinds of combinations at the same time to provide more capacitors or more choices capacitor values. Additionally, in some examples, the capacitor device containing one or more capacitors may be incorporated in a circuit board at various locations. For example, an embedded capacitor device may be placed at or near a center layer of the circuit board. In another example, the embedded capacitor device may include two or more embedded capacitor cores, with one of them being near the top portion of a circuit board and the second one of them being near the bottom portion of the circuit board. In some examples, the embedded capacitor device may have a power wiring layer and a ground wiring layer in the circuit board, and the power wiring layer and/or the ground wiring layer may be placed close or adjacent to the embedded capacitor device or one of its embedded core(s) for providing necessary connections.

As noted above, examples of an embedded capacitor device, its configuration, and related applications are provided. Those skilled in the art would appreciate that they can make changes to the examples described above without departing from the broad inventive concept described herein. Accordingly, this invention is not limited to the particular examples disclosed, but is intended to cover modifications within the spirit and scope of the present invention as defined by the appended claims.

We claim:

1. An embedded capacitor device within a circuit board having an integrated circuitry thereon, the circuit board having a common coupling area under the integrated circuitry, the embedded capacitor device comprising:
   a capacitor section providing at least one capacitor to a first terminal set of the integrated circuitry, a portion of the capacitor section being in the common coupling area and having its coupling to the first terminal set located in the common coupling area, the capacitor section comprising a first electrode and a second electrode with a dielectric layer between the first and the second electrodes, the first electrode comprising:
   a first sub-section; and
   a second sub-section coupled to the first sub-section through a conductive interconnection, the first and second sub-sections being coplanar.

2. The embedded capacitor device of claim 1, wherein the second electrode further comprises:
   third sub-section; and
   a fourth sub-section coupled to the third sub-section through a second conductive interconnection, the third and fourth sub-sections being coplanar
   wherein the first sub-section corresponds to the third sub-section, and the second sub-section corresponds to the fourth sub-section.

3. The embedded capacitor device of claim 2, wherein the third and fourth sub-sections are coplanar.

4. The embedded capacitor device of claim 1, wherein the embedded capacitor device at least serves as one embedded decoupling capacitor for the integrated circuit.

5. The embedded capacitor device of claim 1, wherein the capacitor section is a first capacitor section, and the embedded capacitor device further comprises:
   a second capacitor section providing at least one capacitor to a second terminal set of the integrated circuitry, a portion of the second capacitor section being in the common coupling area and having its coupling to the second terminal set located in the common coupling area.

6. The embedded capacitor device of claim 5, wherein the first capacitor section and second capacitor section both belong to a first planar, multilayer structure having the first and second capacitor sections arranged horizontally, the embedded capacitor device further comprising:
   a third capacitor section;
   a fourth capacitor section, wherein the third and fourth capacitor sections both belong to a second planar, multilayer structure having the third and fourth capacitor sections arranged horizontally;
   and
   an inter-layer dielectric material positioned between the first and second planar, multilayer structures.

7. The embedded capacitor device of claim 5, wherein the first capacitor section and the second capacitor section are electrically coupled to each other through at least one conductive via located in the common coupling area.

8. The embedded capacitor device of claim 5, wherein at least one of the first capacitor section and the second capacitor section comprises at least two separate capacitive devices electrically coupled in parallel.

9. A printed circuit board comprising:
   at least one embedded capacitor device, each embedded capacitor device including a plurality of layers to form a plurality of capacitor structures,
   wherein the embedded capacitor device comprises at least two capacitor sections each having a portion of the capacitor section within a common coupling area for at least one integrated circuitry, wherein one of the at least two capacitor sections comprises a first electrode and a second electrode with a dielectric layer between the first and the second electrodes, the first electrode comprising:
   a first sub-section; and
   a second sub-section coupled to the first sub-section through a conductive interconnection, the first and second sub-sections being coplanar.

10. The printed circuit board of claim 9, wherein the plurality of layers include a plurality of layers of conductive patterns with at least one dielectric layer between the plurality of layers of conductive patterns.

11. The printed circuit board of claim 9, wherein the two capacitor sections both belong to one planar, multilayer structure having the two capacitor sections arranged horizontally, and the two capacitor sections comprise:
   a first capacitor section providing at least one decoupling capacitor to the integrated circuitry; and
   a second capacitor section providing at least one decoupling capacitor to the integrated circuitry.

12. The printed circuit board of claim 11, wherein the planar, multilayer structure is a first planar, multilayer structure and the printed circuit board further comprises:
   a third capacitor section;
   a fourth capacitor section, wherein the third and fourth capacitor sections both belong to a second planar, multilayer structure having the third and fourth capacitor sections arranged horizontally;

and an inter-layer dielectric material positioned between the first and second planar, multilayer structures.

13. The printed circuit board of claim 11, wherein the first capacitor section and the second capacitor section electrically coupled to each other through at least one conductive via in the common coupling area.

14. The printed circuit board of claim 11, wherein at least one of the two capacitor sections comprises at least two separate capacitive devices electrically coupled in parallel.

15. The printed circuit board of claim 9, wherein the second electrode comprises:

a third sub-section; and a fourth sub-section coupled to the third sub-section through a second conductive interconnection, the third and fourth sub-section being coplanar, wherein the third sub-section corresponds to the first sub-section, and the fourth sub-section corresponds to the second sub-section.

16. An embedded capacitor device within a circuit board, the embedded capacitor device comprising a capacitor section including:

a first electrode; and a second electrode with a dielectric layer between the first and the second electrodes, the first electrode comprising:

a first sub-section; and a second sub-section coupled to the first sub-section through a conductive interconnection, the first and second sub-section being coplanar.

17. The embedded capacitor device of claim 16, wherein the second electrode comprises:

a third sub-section; and a fourth sub-section coupled to the third sub-section through a second conductive interconnection, the third and fourth sub-sections being coplanar.

18. The embedded capacitor device of claim 17, wherein the third sub-section corresponds to the first sub-section, and the fourth sub-section corresponds to the second sub-section.

19. The embedded capacitor device of claim 18, wherein the third sub-section has a shape similar to a shape of the first sub-section, and the fourth sub-section has a shape similar to a shape of the second sub-section.

* * * * *

UNITED STATES PATENT AND TRADEMARK OFFICE
CERTIFICATE OF CORRECTION

| | | |
|---|---|---|
| PATENT NO. | : 7,875,808 B2 | Page 1 of 1 |
| APPLICATION NO. | : 11/531337 | |
| DATED | : January 25, 2011 | |
| INVENTOR(S) | : Huey-Ru Chang et al. | |

It is certified that error appears in the above-identified patent and that said Letters Patent is hereby corrected as shown below:

Claim 6, col. 10, line 18, "haying" should read --having--.

Signed and Sealed this
Third Day of May, 2011

David J. Kappos
*Director of the United States Patent and Trademark Office*

UNITED STATES PATENT AND TRADEMARK OFFICE
CERTIFICATE OF CORRECTION

PATENT NO. : 7,875,808 B2  Page 1 of 1
APPLICATION NO. : 11/531337
DATED : January 25, 2011
INVENTOR(S) : Huey-Ru Chang et al.

It is certified that error appears in the above-identified patent and that said Letters Patent is hereby corrected as shown below:

Claim 2, col. 9, line 56, "third subsection" should read --a third subsection--.

Signed and Sealed this
Twenty-third Day of August, 2011

David J. Kappos
*Director of the United States Patent and Trademark Office*